United States Patent [19]

Ueno

[11] Patent Number: 5,809,073
[45] Date of Patent: Sep. 15, 1998

[54] DECISION FEEDBACK EQUALIZER AND METHOD OF SETTING 2-INPUT DECISION SLICE

[75] Inventor: Hiroaki Ueno, Kawasaki, Japan

[73] Assignee: Fujitsu Limited, Kawasaki, Japan

[21] Appl. No.: 570,110

[22] Filed: Dec. 11, 1995

[30] Foreign Application Priority Data

May 18, 1995 [JP] Japan ................................ 7-119503

[51] Int. Cl.⁶ ............................ H03H 7/30; H03K 5/159
[52] U.S. Cl. ........................................ 375/233; 364/724.2
[58] Field of Search .................................... 375/233, 348, 375/350, 232, 229; 364/724.2; 360/65; 333/18

[56] References Cited

U.S. PATENT DOCUMENTS 5,524,125   6/1996   Tsujimoto ........................... 375/233
5,561,687  10/1996   Turner ................................ 375/233

FOREIGN PATENT DOCUMENTS 62-247632  10/1987  Japan .
62-247633  10/1987  Japan .
 5135499    6/1993  Japan .
 5234267    9/1993  Japan .
 6036208    2/1994  Japan .

OTHER PUBLICATIONS

Enhanced Decision Feedback Equalization, IEEE Transaction on Magnetics, vol. 26, No. 5, Sep. 1990, pp. 2178–2180.

Primary Examiner—Stephen Chin
Assistant Examiner—Betsy L. Deppe
Attorney, Agent, or Firm—Greer, Burns & Crain, Ltd.

[57] ABSTRACT

A decision slice setting unit of a 2-input judging unit has two coordinates (A) and (B) to be judged as −1 and two coordinates (C) and (D) to be judged as +1 into which input coordinates (f, g) can be set in a noiseless state. A straight line which passes through an origin and is parallel with each of a straight line connecting the two coordinates (A) and (B) to be judged as −1 and a straight line connecting the two coordinates (C) and (D) to be judged as +1 is set as a decision slice.

32 Claims, 10 Drawing Sheets

Fig. 7

| COORDINATES | INPUT BIT | | FIRST WAVEFORM RECTIFYING FILTER OUTPUT f | SECOND WAVEFORM RECTIFYING FILTER OUTPUT g |
|---|---|---|---|---|
| | $a_k$ | $a_{k+1}$ | $f=1.25a_k+0.5a_{k+1}$ | $g=0.75a_k-0.5a_{k+1}$ |
| D | +1 | +1 | +1.75 | +0.25 |
| C | +1 | −1 | +0.75 | +1.25 |
| B | −1 | +1 | −0.75 | −1.25 |
| A | −1 | −1 | −1.75 | −0.25 |

DECISION FEEDBACK EQUALIZER AND METHOD OF SETTING 2-INPUT DECISION SLICE

BACKGROUND OF THE INVENTION

The invention relates to a decision feedback equalizer to discriminate a code series from a magnetic conversion channels having a head and a disk medium and, more particularly, to a decision feedback equalizer for optimizing the setting of a decision slice that is used for judgment at two-dimensional coordinates of a code series converted into two different correlation waveforms and to a two-input decision slice setting method.

In recent magnetic recording apparatus, a bit interval is narrowed more and more due to the realization of a high processing speed and a large capacity. An inter-waveform interference in a reproduction output is inevitable due to magnetic converting characteristics by the head and the recording medium. Therefore, in place of the conventional method of judging a code series after the inter-waveform interference was eliminated, a method whereby the inter-waveform interference of a code series is controlled, shaped to a correlation waveform and judged is considered.

Hitherto, an attention is paid to a decision feedback equalization (DFE) method as a method whereby an inter-waveform interference of a transmission code series is controlled, shaped into two correlation waveforms and judged from the correlation waveforms. According to the DFE method, a code series signal having the controlled inter-waveform interference is formed by a forward filter for equalizing to a transmission channel of a magnetic converting system and a correlation waveform. Subsequently, the sum of the values obtained by multiplying estimation coefficients of the inter-waveform interference to the judgment result of a 2-input judging unit is obtained by a feedback filter and is subtracted from a code series that is outputted from the forward filter, thereby eliminating the inter-waveform interference. The code series from which the estimated inter-waveform interference is eliminated is given to the judging unit and the input series is discriminated by a simple 2-value judging unit from an analog amount of one bit.

In such a 2-value judging unit, however, since it does not have bit information of adjacent codes, a desired S/N ratio cannot be sufficiently reduced. Therefore, in order to give adjacent bit information to a transmission code series as a target of the judgment, bit information is transmitted through two kinds of correlation filters and output signals (f) and (g) of the correlation filters are inputted to the 2-input judging unit. The 2-input judging unit has a judgment space using the correlation signals (f) and (g) as two-dimensional coordinates and compares the coordinates (f, g) of the two input correlation signals (f) and (g) with a preset decision slice, thereby judging the transmission code series. Such a decision feedback equalization method of performing a judgment including the adjacent bit information is known as an enhanced decision feedback equalization (EDFE) method (for example, refer to "Enhanced Decision Feedback Equalization", IEEE Transactions on Magnetics., Vol. 26, No. 5, pages 2178–2180, September, 1990).

FIG. 1 shows a conventional decision feedback equalizer for judging while including adjacent bit information. The equalizer is constructed by: a forward filter 200; an adder 202; first and second waveform shaping filters 204 and 206 as two kinds of correlation filters; a 2-input judging unit 208; and a feedback filter 212.

FIG. 2 shows a judgment space of the 2-input judging unit 208 in FIG. 1. A transfer function of the first waveform shaping filter 204 is decided in a manner such that when adjacent bit information $(a_k, a_{k+1})$ of a code series is equal to $(+, +1)$ or $(-1, -1)$, the filter output (f) is increased. A transfer function of the second waveform shaping filter 206 is determined in a manner such that when the adjacent bit information $(a_k, a_{k+1})$ of the code series differs from $(+1, -1)$ or $(-1, +1)$, the filter output (g) is increased. For example, the filter outputs (f) and (g) are obtained as follows.

$$f = 1.25 a_k + 0.5 a_{k+1}$$

$$g = 0.75 a_k - 0.5 a_{k+1}$$

When there is no noise, four coordinate positions (A, B, C, and D) can be set. With respect to the case where the bit information $a_k$ should be judged as $-1$, the coordinate position (A) is set to $(f, g) = (-1.75, -0.25)$ when the adjacent bit information $(a_k, a_{k+1}) = (-1, -1)$ and the coordinate position (B) is set to $(f, g) = (-0.75, -1.25)$ when the adjacent bit information $(a_k, a_{k+1}) = (-1, +1)$. With respect to the case where the bit information $a_k$ should be judged as $+1$, the coordinate position (C) is set to $(f, g) = (+0.75, +1.25)$ when the adjacent bit information $(a_k, a_{k+1}) = (+1, -1)$ and the coordinate position (D) is set to $(f, g) = (+1.75, +0.25)$ when the adjacent bit information $(a_k, a_{k+1}) = (+1, +1)$.

A conventional decision slice 218 is set by a composite straight line obtained by coupling straight lines 218-1, 218-2, and 218-3. When the input coordinates (f, g) exist on the right side of the decision slice 218, the code $a_k$ is decided to be $+1$. When the input coordinates (f, g) exist on the left side of the decision slice 218, the code $a_k$ is decided to be $-1$. The straight line portion 218-1 constructing the decision slice 218 is a straight line 214 that is parallel with a coordinate axis (g) passing through the coordinates (B) near an origin (O) in the coordinates (A) and (B) to be judged as $-1$. The straight line portion 218-3 is a straight line 216 that is parallel with the coordinate axis (g) passing through the coordinates (C) near the origin (O) in the coordinates (C) and (D) to be judged as $+1$. The two straight lines 214 and 216 are coupled by the straight line portion 218-2 passing through the origin (O). That is, the 2-input judgment in FIG. 2 is performed by referring to only a coordinate axis (f) when the absolute value of the filter output (f) is larger than the noiseless coordinates (C) of different adjacent bit information. When the absolute value of the filter output (f) is equal to or less than the noiseless coordinates (C), the 2-input judgment is performed on the basis of a discrimination regarding whether the value is larger or smaller than zero of the axis (g).

However, in such a conventional 2-input judging unit in the decision feedback equalizer, in case of using the decision slice as shown in FIG. 2, there is an area in which the distance from the noiseless coordinates to the decision slice is extremely small. When the input coordinates (f, g) are located in such an area, an erroneous judgment easily occurs. Namely, in the judgment space of FIG. 2, each of the distance between an edge portion 220 of the decision slice 218 and the noiseless coordinates (B) and the distance between an edge portion 222 and the noiseless coordinates (D) becomes the minimum distance. When the input coordinates (f, g) by the mixture of noises are located in the above area, there are problems such that a probability of the erroneous judgment rises and a desired S/N ratio increases.

SUMMARY OF THE INVENTION

According to the invention, a decision feedback equalizer for optimizing a decision slice which is used in a 2-input judgment including adjacent bit information and for reducing a desired S/N ratio and a 2-input decision slice setting method are provided.

First, in order to have the adjacent bit information, the decision feedback equalizer of the invention inputs input code series $y_n$ having two values of +1 and/or −1 to a 2-input judging unit through first and second waveform shaping filters (correlation filters) in which an inter-waveform interference occurs at a one-sample interval (T) and inter-waveform interference coefficients are different. The 2-input judging unit sets input coordinates (f, g) of a 2-dimensional coordinate space by input signals (f) and (g) from the filters and compares the input coordinates (f, g) with a predetermined decision slice, thereby judging values of 2-value input code series.

A decision slice setting unit of the 2-input judging unit uses any one of the decision slices of the following modes 1 to 4.

[Mode 1]

For two coordinates (A) and (B) to be judged as −1 and two coordinates (C) and (D) to be judged as +1 into which the input coordinates (f, g) can be set in a noiseless state, the decision slice setting unit of the 2-input judging unit sets a straight line, as a decision slice. The decision slice passesthrough an origin and is parallel with each of a straight line connecting the two coordinates (A) and (B) to be judged as −1 and a straight line connecting the two coordinates (C) and (D) to be judged as −1 which are in a parallel relation.

[Mode 2]

The decision slice setting unit of the 2-input judging unit assumes: a first straight line which passes through the origin and is parallel with each of a straight line connecting the two coordinates (A) and (B) to be judged as −1 and a straight line connecting the two coordinates (C) and (D) to be judged as +1; a second straight line which is parallel with a coordinate axis (g) and passes through the coordinates (B) near the origin in the two coordinates (A) and (B) to be judged as −1; and a third straight line which is parallel with the coordinate axis (g) and passes through the coordinates (C) near the origin in the two coordinates (C) and (D) to be judged as +1. The decision slice setting unit sets the decision slice by a composite straight line obtained by connecting: a straight line portion which is in the second straight line and is away from an intersection point of the first and second straight lines for the coordinates (A) and (B); a straight line portion which is in the first straight line and passes through the origin (O) between an intersection point of the first and second straight lines and an intersection point of the first and third straight lines; and a straight line portion which is in the third straight line and is away from the intersection point of the first and third straight lines for the coordinates (C) and (D).

[Mode 3]

The decision slice setting unit of the 2-input judging unit assumes: a first straight line which passes through the origin and is parallel with each of a straight line coupling the two coordinates (A) and (B) to be judged as −1 and a straight line coupling the two coordinates (C) and (D) to be judged as −1; and two second and third straight lines whose distances from each of the coordinates are constant with respect to two sets of coordinates (A, C) and (B, D) in which only one of input code series ($a_k$, $a_{k+1}$) in a noiseless state differs. The decision slice setting unit sets a decision slice by a composite straight line obtained by connecting: a straight line portion which is in the second straight line and is away from the intersection point of the first and second straight lines for the coordinates (A) and (B); a straight line portion which is in the first straight line and passes through the origin (O) between an intersection point of the first and second straight lines and an intersection point of the first and third straight lines; and a straight line portion which is in the third straight line and is away from the intersection point of the first and third straight lines for the coordinates (C) and (D).

[Mode 4]

Further, the decision slice setting unit of the 2-input judging unit assumes: two first and second straight lines whose distances from each of the coordinates are constant with respect to two sets of coordinates (A, C) and (B, D) in which only one of input code series ($a_k$, $a_{k+1}$) in a noiseless state is different; a third straight line which is parallel with the coordinate axis (g) and passes through the coordinates (B) near the origin in the two coordinates (A) and (B) to be judged as −1; and a fourth straight line which is parallel with the coordinate axis (g) and passes through the coordinates (C) near the origin in the two coordinates (C) and (D) to be judged as +1. The decision slice setting unit sets a decision slice by a composite straight line obtained by connecting: a straight line portion which is in the first straight line and is away from the intersection point of the first and third straight lines for the coordinates (A) and (B); a straight line portion which passes through the origin and connects an intersection point of the first and third straight lines and an intersection point of the second and fourth straight lines; and a straight line portion which is in the second straight line and is away from an intersection point of the second and fourth straight lines for the coordinates (C) and (D).

With respect to each of the modes 1 to 4, a feedback equalizer of the invention comprises: a forward filter for forming a correlation waveform $r_n$ from input code series $a_n$ from a transmission channel (transmission path); a feedback filter for obtaining an inter-waveform interference amount $ISI_k$ from the sum of products of judgment results of the 2-input judging unit and a predetermined inter-waveform interference coefficient (h); and an adding unit for inputting, in parallel, code series $y_n$ obtained by subtracting the inter-waveform interference amount $ISI_k$ from the correlation waveform $r_n$ to the first and second waveform shaping filters. As another aspect of the invention, the feedback filter obtains the inter-waveform interference amount $ISI_k$ by the sum of the products of (P−1) judgment results among the (P) judgment results of inter-waveform interferences by the 2-input judging unit and the inter-waveform interference coefficient (h) and subtracts $ISI_k$ from the correlation waveform $r_n$. In association with such a method, the first and second waveform shaping filters can be simplified. Namely, two kinds of different correlation waveform generating coefficients hf and hg are multiplied by multipliers to one judgment result which is not used in the arithmetic operations of the inter-waveform interference amounts by the first and second waveform shaping filters and feedback filter. Signals (f) and (g) obtained by subtracting the resultant multiplication output values from the code series $y_n$ of the adding unit are supplied to the 2-input judging unit. As a transmission channel in the decision feedback equalizer of the present invention, a magnetic converting channel including a write head, a recording medium, and a read head of a magnetic recording and reproducing apparatus is used as a target.

According to such decision feedback equalizer and its 2-input decision slice setting method of the invention, since a judgment including the interference of the adjacent bit information is executed as a judgment of the input code series, the optimum decision slice can be set as a decision slice that is used for such a judgment so as not to form an area in which a distance is extremely small for noiseless coordinates and which becomes a cause of an erroneous judgment. A desired S/N ratio to obtain a specified error rate can be reduced. The reliability of a magnetic disk apparatus of a high transfer speed and a high density recording can be remarkably improved.

The above and other objects, features, and advantages of the present invention will become more apparent from the following detailed description with reference to the drawings.

BRIEF DESCRIPTION OF THE DRAWINGS

FIG. 7 is an explanatory diagram of a specific example of an input and an output of a waveform shaping filter of the invention;

DETAILED DESCRIPTION OF THE PREFERRED EMBODIMENTS

Figure 3:
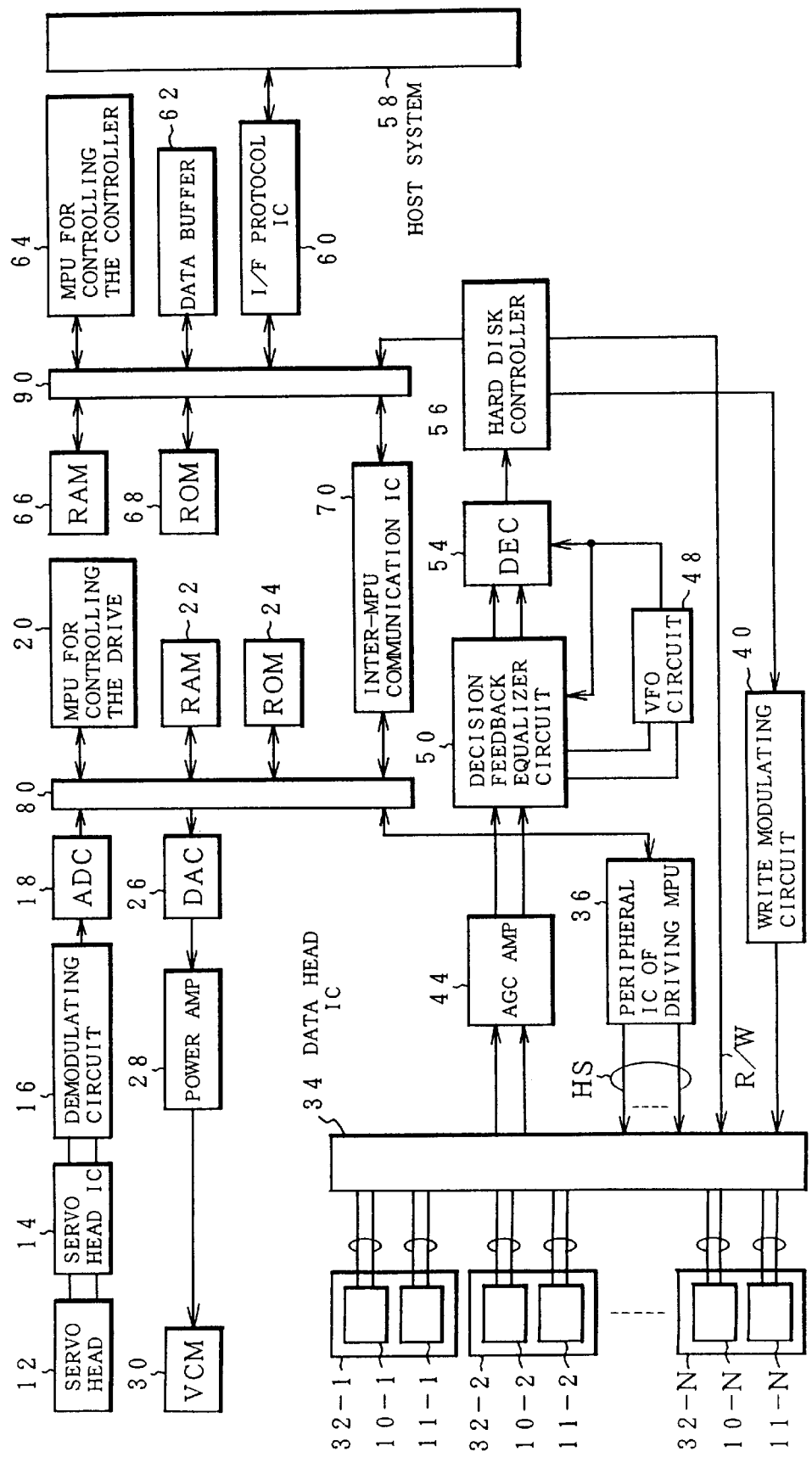
FIG. 3 is a block diagram of a magnetic disk apparatus to which the invention is applied.

FIG. 3 is a block diagram of a magnetic disk apparatus having a decision feedback equalizer of the invention. A servo head 12 is positioned so as to face a servo surface of a magnetic disk and uses an inductive head. A combination type magnetic head can be also used to realize a common use of parts. A read signal from the servo head 12 is processed by a servo head IC 14. A position signal is demodulated by a position signal demodulating circuit 16. A demodulated analog position signal is converted into a digital signal by an A/D converter 18. The digital signal is sent to an MPU 20 for a drive control through a bus 80. The drive controlling MPU 20 executes processes necessary for a position control of the head by a VCM 30, a rotation control of the magnetic disk by a spindle motor (not shown), and the like. A RAM 22 and a ROM 24 are provided for the drive controlling MPU 20 through the bus 80. Further, a D/A converter 26 for converting digital information for a position control from the drive controlling MPU 20 to the VCM 30 into an analog signal is provided for the bus 80. After an output of the D/A converter 26 was amplified by a power amplifier 28, the VCM 30 is driven, thereby controlling the head position. On the other hand, data heads 32-1 to 32-N are provided for a data head IC 34. Each of the data heads 32-1 to 32-N is positioned so as to face a corresponding data surface of the magnetic disk. Combination type heads comprising read heads 10-1 to 10-N and write heads 11-1 to 11-N are used as data heads 32-1 to 32-N. Among them, inductive heads are used as write heads 11-1 to 11-N. MR heads are used as read heads 10-1 to 10-N. A head selection signal HS is supplied to the data head IC 34 through a peripheral IC 36 of the driving MPU. Further, a read/write switching signal R/W is given from a hard disk controller 56 to the data head IC 34. A read signal obtained from the read head of any selected one of the data heads 32-1 to 32-N is supplied to an AGC amplifier 44 through the data head IC 34. The read signal amplified by the AGC amplifier 44 is inputted to a decision feedback equalizer circuit 50, by which read data is demodulated in accordance with a decision feedback equalizing method. A VFO circuit 48 receives a read signal from a proper circuit stage of the decision feedback equalizer circuit 50 and generates a clock synchronized with the read data demodulated. The read data demodulated by the decision feedback equalizer circuit 50 is subjected to a decoding of, for example, a 1/7 RLL code by a decoder 54, thereby demodulating NRZ data and supplying to the hard disk controller 56. The hard disk controller 56 has a function as a formatter. After an ECC process or the like for the NRZ data from the decoder 54 was executed, the read data is transferred to a host system 58 by an I/F protocol IC 60 via a data buffer 62. In the writing operation, the hard disk controller 56 executes an ECC conversion of write data received likewise from the host system 58 via the data buffer 62. After that, the writing operation is executed by the write head of the proper data head selected by the head IC 34 through a write modulating circuit 46. An MPU 64 for controlling a controller analyzes a command transferred from the host system 58 and executes a corresponding process. A RAM 66 and a ROM 68 are connected to the controller controlling MPU 64 through a bus 90. Further, the MPU 64 executes a communication with the drive controlling MPU 20 of the bus 80 through an inter-MPU communication IC 70.

The magnetic disk apparatus of FIG. 3 has been shown and described with respect to a servo surface servo system as an example. However, in case of a data surface servo system, portions from the servo head 12 to the A/D converter 18 are unnecessary. It is possible to construct in a manner such that a line from the data head IC 34 to the AGC amplifier 44 is branched and is inputted to a servo demodulating circuit only for use in a data surface servo and a position signal demodulated by the servo demodulating circuit is supplied to the drive controlling MPU 20 by the A/D converter.

Figure 4:
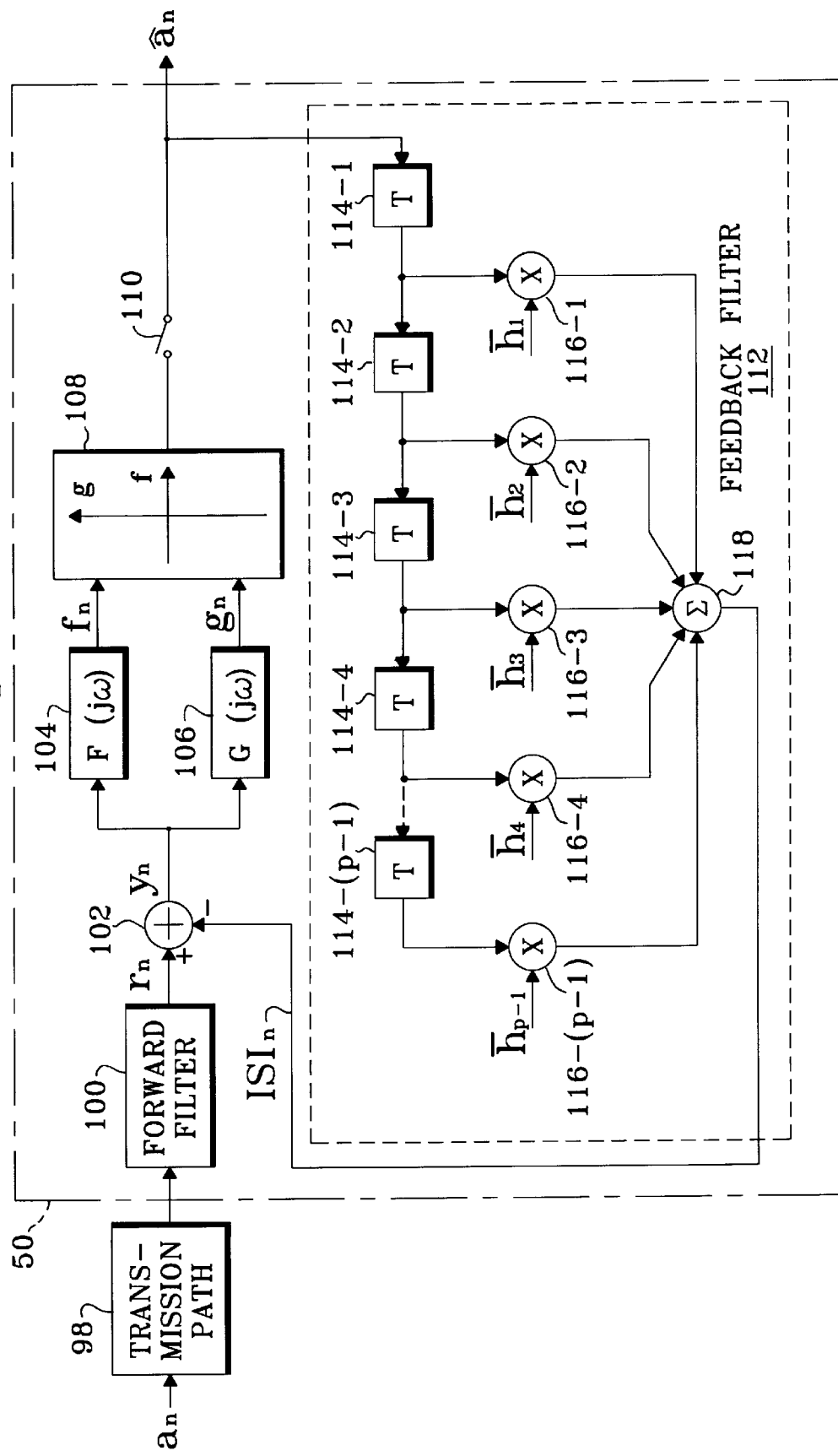
FIG. 4 is a block diagram of an embodiment of the invention having a 2-input judging unit of a correlation filter in FIG. 3.

FIG. 4 is a block diagram of an embodiment of the decision feedback equalizer circuit 50 provided in the read demodulating circuit unit in FIG. 3. A transmission path 98 for the decision feedback equalizer circuit 50 shows a magnetic converting system in the magnetic disk apparatus of FIG. 3 as an equivalent circuit. Namely, the transmission path 98 is regarded as a transmission path for receiving write data in the writing operation as input transmission code series $a_n$ and reading out code series recorded through a magnetic converting system by the write head, magnetic disk, and read head. Subsequent to the transmission path 98 constructed by such a magnetic converting system, a forward filter 100 is provided at the input stage of the decision feedback equalizer circuit 50. The forward filter 100 generates a correlation waveform $r_n$ by a correlation waveform equalizing process for transmission path characteristics of the transmission path 98 constructed by the magnetic converting system.

Now, assuming that the input transmission code series $a_n$ for the transmission path 98 is $$a_n = \sum_{n=0}^{\infty} a_n \delta(t - nT)$$

where, T is a sampling interval, an impulse response of the transmission path 98 and forward filter 100 is $$r(t) = \sum_{p=0}^{P-1} h_p \delta(t - pT)$$

It is now assumed that the above impulse response has (P) responses which are not "0" and inter-waveform interference coefficients $h_p$ of the impulse response have $h_p \epsilon \{h_0, h_1, h_2, \ldots, h_{p-1}\}$ In case of the impulse response by an isolated read waveform of, for example, a standardized linear density of $W_{50}/T=2.5$, the inter-waveform interference coefficients are $h_p \epsilon \{1, \frac{1}{2}, -\frac{1}{2}, -\frac{1}{2}, -\frac{1}{4}, -\frac{1}{8}, -\frac{1}{16}\}$ Therefore, the correlation waveform r. which is obtained by the characteristics of the transmission path 98 and the correlation waveform equalization of the forward filter 100 can be expressed by $$r_n = \sum_n \cdot \sum_{p=0}^{P-1} h a_n h_p \delta\{t - (n+p)T\}$$

The correlation waveform $r_n$ outputted from the forward filter 100 is inputted to an adder 102. The adder 102 executes a subtraction of an inter-waveform interference amount $ISI_n$ by the preceding transmission code series in the correlation waveform $r_n$ obtained by a feedback filter 112, thereby producing transmission code series $y_n$.

The feedback filter 112 is constructed by: (P–1) delay circuits with taps 114-1 to 114-(P–1); multipliers 116-1 to 116-(P–1) for performing multiplications of tap coefficients; and an adder 118 to obtain the sum of multiplication results of the multipliers 116-1 to 116-(P–1). An impulse response of the feedback filter 112 is $$\bar{h}(t) = \sum_{m=1}^{P-1} \bar{h}_m \delta(t - mT)$$

The feedback filter 112 sequentially receives judgment results $a_{n-1}$ to $a_{n-(p-1)}$ of a 2-input judging unit 108 at a timing of the sampling period (T) by a sampler 110 and sets to outputs of the delay circuits 114-1 to 114-(P–1). The inter-waveform interference coefficients $h_p \epsilon \{h_1, h_2, h_3, \ldots, h_{p-1}\}$ are multiplied to the judgment results $a_{n-1}$ to $a_{n-(P-1)}$ by the multipliers 116-1 to 116-(P–1). The sum of the multiplication results is calculated by the adder 118, thereby obtaining the inter-waveform interference amount $ISI_N$ by the preceding transmission code series in the correlation waveform $r_n$. Namely, the inter-waveform interference amount $ISI_n$ is given by $$ISI_n = \sum_n \cdot \sum_{p=1}^{P-1} a_{n-1} \bar{h}_p \delta\{t - (n+p)T\}$$

Therefore, the transmission code series $y_n$ obtained by subtracting the inter-waveform interference amount $ISI_n$ from the correlation waveform $r_n$ that is outputted from the adder 102 is expressed by the following equation.

$$y_n = r_n - |S|_n = \sum_n a_n \delta(t - nT)$$

Two kinds of correlation filters are used in order to give adjacent bit information to the transmission code series $y_n$ produced as mentioned above. In the embodiment, one of the correlation filters is set to a first waveform shaping filter 104 having a transfer function $F(j\omega)$ and the other correlation filter is set to a second waveform shaping filter 106 having a transfer function $G(j\omega)$. It is now preferable to set in a manner such that as a first waveform shaping filter 104, so long as the adjacent bit information is equal, an output $f_n$ is increased and that, on the other hand, as a second waveform shaping filter 106, when the adjacent bit information differs, an output $g_n$ is increased.

In the embodiment, when it is assumed that the inter-waveform interference coefficients $f_n$ of the first waveform shaping filter 104 and the inter-waveform interference coefficients $g_n$ of the second waveform shaping filter 106 are $f_n \epsilon \{f_0, f_1\}$
$g_n \epsilon \{g_0, g_1\}$ their transfer functions f(t) and g(t) are given by $$f(t) = \sum_{m=0}^{1} f_m \delta(t - mT)$$

$$g(t) = \sum_{m=0}^{1} g_m \delta(t - mT)$$

Therefore, when the transmission code series $y_n$ is inputted from the adder 102, the outputs $f_n$ and $g_n$ of the first waveform shaping filter 104 and second waveform shaping filter 106 a re given by $$f_n = \sum_n \cdot \sum_{m=0}^{1} a_n f_m \delta\{t - (n+m)T\}$$

$$g_n = \sum_n \cdot \sum_{m=0}^{1} a_n g_m \delta\{t - (n+m)T\}$$

where, $\delta(t)$ denotes an impulse function and has a value of $\delta(t)=1$ when t=0 and a value of $\delta(t)=0$ when $t \neq 0$. In this manner, the filter outputs $f_n$ and $g_n$ derived by the two kinds of waveform shaping processes in which inter-waveform interference coefficients are different in the first waveform shaping filter 104 and second waveform shaping filter 106 are inputted to the 2-input judging unit 108. The 2-input judging unit 108 has a 2-dimensional coordinate space in which the input signals (f) and (g) are set to coordinate axes. In a noiseless state, as will be obviously explained herein later, four coordinate positions (A), (B), (C), and (D) can be plotted. Noises are actually multiplexed to those four noiseless coordinate positions (A) to (D). A check is made to see if the input coordinates $(f_n, g_n)$ have which one of the values of −1 and +1 of the two-value code series in accordance with the decision slice which was properly set. The judgment value is outputted as a judgment result of the transmission code series $a_n$. The judgment result is given by $$a_n = \sum_n a_n \delta(t - nT)$$

Figure 5:
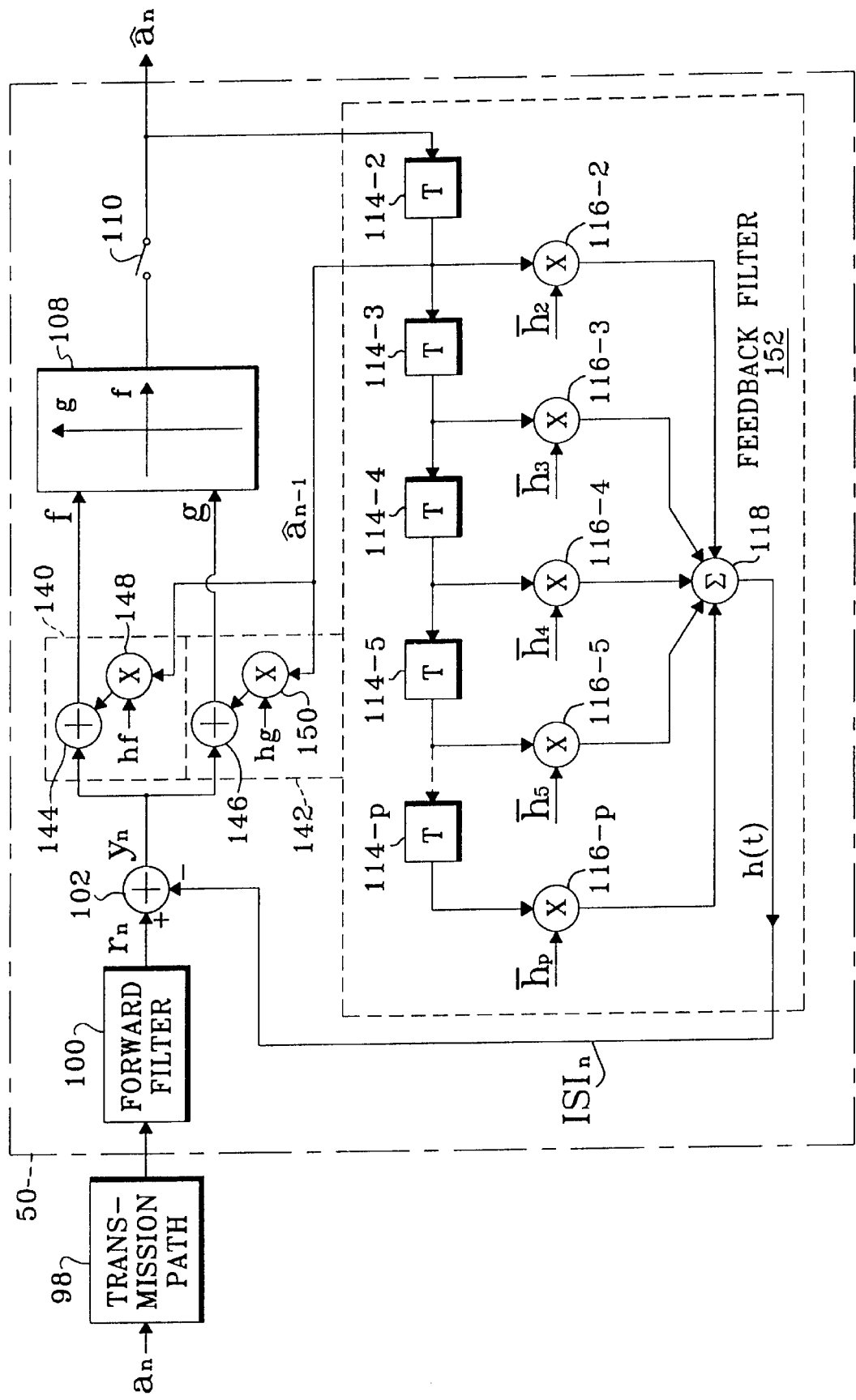
FIG. 5 is a block diagram of another embodiment of the invention in which the correlation filter is simplified.

FIG. 5 shows another embodiment of the decision feedback equalizer circuit 50 which is used in the invention. The embodiment is characterized in that the two kinds of correlation filters provided for the 2-input judging unit are simplified. The transmission path 98 and the forward filter 100, adder 102, and 2-input judging unit 108 provided in the decision feedback equalizer circuit 50 are substantially the same as those in the embodiment of FIG. 3. On the other hand, a construction of a feedback filter 152 to obtain the inter-waveform interference amount $ISI_n$ and a construction of a first waveform shaping filter 140 and a second waveform shaping filter 142 constructing two kinds of correlation filters differ. The feedback filter 152 obtains the inter-waveform interference amount $ISI_n$ by the (P−1) judgment results among the (P) judgment results outputted from the 2-input judging unit 108 and the sum of products of the inter-waveform interference coefficients h2 to hp. Specifically speaking, the feedback filter 152 is constructed by: the (P−1) delay circuits with taps 114-2 to 114-P; multipliers 116-2 to 116-P for multiplying the inter-waveform interference coefficients h2 to hp as tap coefficients to delay outputs; and an adder 118 for obtaining the sum of multiplication results of the multipliers 116-2 to 116-P.

An impulse response of such a feedback filter 152 is given as follows.

$$\bar{h}(t) = \sum_{m=2}^{p-1} \bar{h}_m \delta(t - mT)$$

The inter-waveform interference amount $ISI_n$ by the preceding transmission code series in the correlation waveform $r_n$ of the forward filter 100 which is obtained by the feedback filter 152 is given by $$ISI_n = \sum_n \cdot \sum_{p=2}^{p-1} a_{n-p} \bar{h}_p \delta\{t - (n+p)T\}$$

Therefore, the transmission code series $y_n$ obtained by subtracting the inter-waveform interference amount $ISI_n$ from the correlation waveform $r_n$ outputted from the adder 102 is given by $$y_n = r_n - ISI_n = \sum_n \cdot \sum_{p=0}^{1} a_n h_p \delta\{t - (n+p)T\}$$

On the other hand, assuming that the inter-waveform interference coefficients in the first and second waveform shaping filters 140 and 142 are set to $f_p \in \{h_0, h_1 - h_f\}$
$g_p \in \{h_0, h_1 - h_g\}$ and that their transfer functions are set to $$f(t) = \sum_{p=0}^{1} f_m \delta(t - pT)$$

$$g(t) = \sum_{p=0}^{1} g_m \delta(t - pT)$$

Thus, the transfer functions for the transmission code series $y_n$ which is inputted from the adder 102 are given by $$f_n = \sum_n \cdot \sum_{p=0}^{1} a_n f_p \delta\{t - (n+p)T\}$$

$$g_n = \sum_n \cdot \sum_{p=0}^{1} a_n g_p \delta\{t - (n+p)T\}$$

Such first and second waveform shaping filters 140 and 142 of different inter-waveform interference coefficients can be easily constructed by adders 144 and 146 and multipliers 148 and 150. For example, in case of the first waveform shaping filter 140, the multiplier 148 obtains the inter-waveform interference amount $ISI_{n-1}$ which is not used in the feedback filter 152 among the (P) judgment results derived from the 2-input judging unit 108. That is, the multiplier 148 multiplies a generating coefficient hf of the correlation waveform to the judgment result $(\hat{a})_{n-1}$, thereby obtaining the inter-waveform interference amount $ISI_{n-1}$. Subsequently, $ISI_{n-1}$ is inputted to the adder 144. The value (hf × $(\hat{a})_{n-1}$) obtained by the multiplier 148 is subtracted from the correlation waveform $y_n$ outputted from the adder 102. The second waveform shaping filter 142 also operates in a manner similar to the above. The multiplier 150 multiplies a correlation waveform generating coefficient hg to the judgment result $(\hat{a})_{n-1}$. The adder 146 subtracts a multiplication result from the multiplier 150 from the transmission code series $y_n$ which is inputted to the adder 146. The outputs (f) and (g) of such simple first and second waveform shaping filters 140 and 142 are inputted to the 2-input judging unit 108 in a manner similar to the embodiment of FIG. 4. Judgment data for the transmission code series $(\hat{a})_n$ is outputted as reception data.

Figure 1:
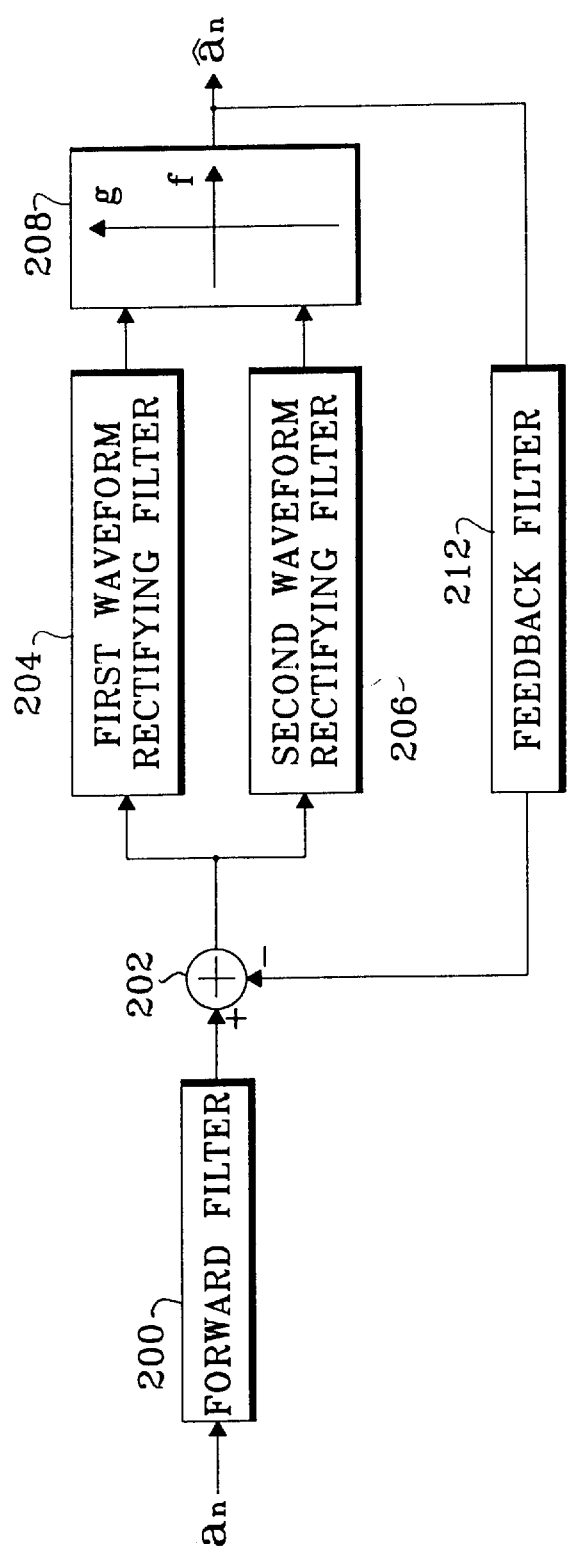
FIG. 1 is a block diagram of a conventional decision feedback equalizer.
Figure 2:
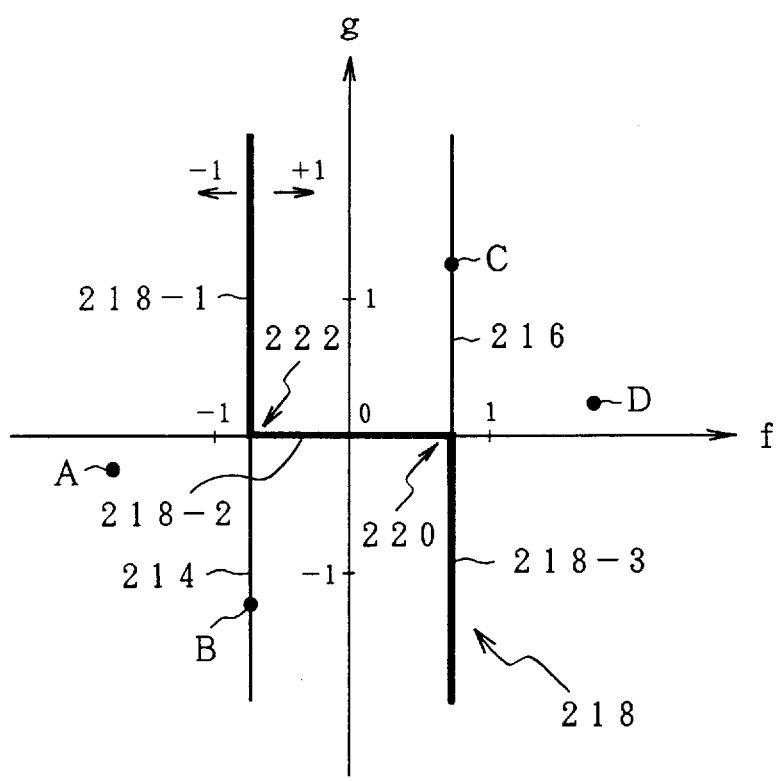
FIG. 2 is an explanatory diagram of a conventional decision slice.
Figure 6:
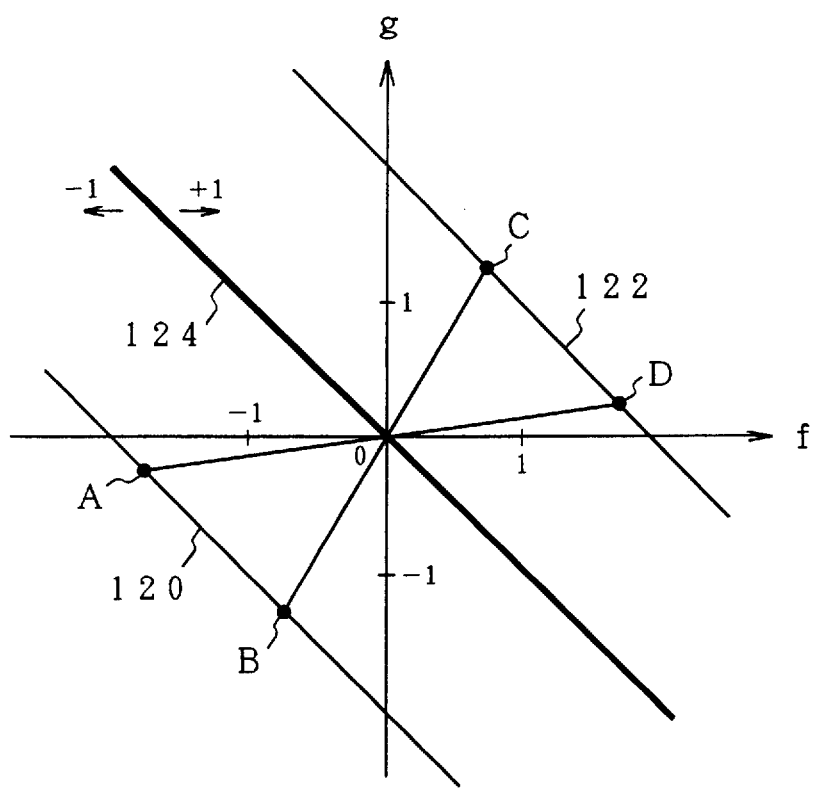
FIG. 6 is an explanatory diagram of the first embodiment of a decision slice according to the invention.

FIG. 6 is an explanatory diagram of a judgment space in the 2-input judging unit 108 provided in the decision feedback equalizer circuit 50 shown in FIGS. 2 and 3 and mode 1 for setting the decision slice in the judgment space. In the judgment space, an axis of abscissa is set to, for example, the output (f) of the first waveform shaping filter 104 in the embodiment of FIG. 4 and an axis of ordinate is set to the output (g) of the second waveform shaping filter 106. For simplicity of explanation, with respect to two adjacent bits in which an input bit at the present time (k) is set to $a_k$ and an input bit which is inputted at the next time (k+1) is set to $a_{k+1}$, explanation will now be made as an example with respect to the case where waveform shaping processes by two different kinds of inter-waveform interference coefficients are executed by the correlation filters. The output (f) of the first waveform shaping filter and the output (g) of the second waveform shaping filter are given by f=1.25$a_k$+0.5$a_{k+1}$
g=0.75$a_k$−0.5$a_{k+1}$ As mentioned above, when the outputs (f) and (g) of the first and second waveform shaping filters are determined, in a noiseless state, four coordinates (A, B, C, D) in FIG. 6 are decided by a combination of the k-th and (k+1)th codes of −1 and +1. The coordinates (A) correspond to the case where both of the k-th and (k+1)th codes are equal to −1 and are plotted to the coordinate values (−1.75, −0.25). The coordinates (B) correspond to the case where the k-th code is equal to −1 and the (k+1)th code is equal to +1 and are plotted to the coordinate values (−0.75, −1.25). Namely, both of the coordinates (A) and (B) give two noiseless coordinates to be judged as −1. The coordinates (C) correspond to the case where the k-th code is equal to +1 and the (k+1)th code is equal to −1 and are plotted to the coordinate values (0.75, 1.25). The coordinates (D) correspond to the case where both of the k-th code and the (k+1)th code are equal to +1 and are plotted to the coordinate values (1.75, 0.25). Those two coordinates (C) and (D) give two noiseless coordinates to be judged as +1 from the filter outputs (f, g).

FIG. 7 collectively shows the codes of two input bits with respect to the four noiseless coordinates (A) to (D) set in the judgment space of mode 1 in FIG. 6 and the values of the filter outputs (f) and (g) corresponding to those codes. When seeing the relation between the coordinates (A) and (C), as will be obviously understood from FIG. 7, the k-th code differs from (−1, +1) and the (k+1)th code is the same as (−1, −1). When seeing the relation between the coordinates (B)

and (D), the k-th code differs from (−1, +1) and the (k+1)th code is the same as (+1, +1). Such code relations in FIG. 6 are expressed as coordinate values of the four noiseless coordinates as follows.

$A(f^{--}, g^{--})$
$B(f^{-+}, g^{-+})$
$C(f^{+-}, g^{+-})$
$D(f^{++}, g^{++})$

Since the values of the coordinate axes (f) and (g) at those coordinate values are determined by the codes of the k-th and (k+1)th input bits, they can be expressed as follows.

$f^{--}=f(a_k, a_{k+1}; -1, -1)$
$f^{-+}=f(a_k, a_{k+1}; -1, +1)$
$f^{+-}=f(a_k, a_{k+1}; +1, -1)$
$f^{++}=f(a_k, a_{k+1}; +1, +1)$
$g^{--}=g(a_k, a_{k+1}; -1, -1)$
$g^{-+}=g(a_k, a_{k+1}; -1, +1)$
$g^{+-}=g(a_k, a_{k+1}; +1, -1)$
$g^{++}=g(a_k, a_{k+1}; +1, +1)$

In the setting of the decision slice of the embodiment of mode 1 in FIG. 6, with respect to the four noiseless coordinates (A) to (D) which have previously been plotted, a straight line 120 connecting the two coordinates (A) and (B) in which the value of the input code series $a_n$ should be judged as −1 and a straight line 122 connecting the two coordinates (C) and (D) in which the value of the input code series $a_n$ should be judged as +1 are presumed. For the straight lines 120 and 122 which were presumed as mentioned above, a straight line 124 which is parallel with both of those straight lines and passes through the origin (O) is set as a decision slice. On the basis of the decision slice which is given by the straight line 124, the input code series is judged as +1 at the coordinate position on the right side of the decision slice and the input code series is judged as −1 at the coordinate position on the left side. By setting the decision slice which is given by the straight line 124 in FIG. 6, a probability of the erroneous judgment of the input code series in the 2-input judging unit 108 can be improved by 2.1 dB (27%) as compared with the conventional decision slice in FIG. 2.

Figure 8:
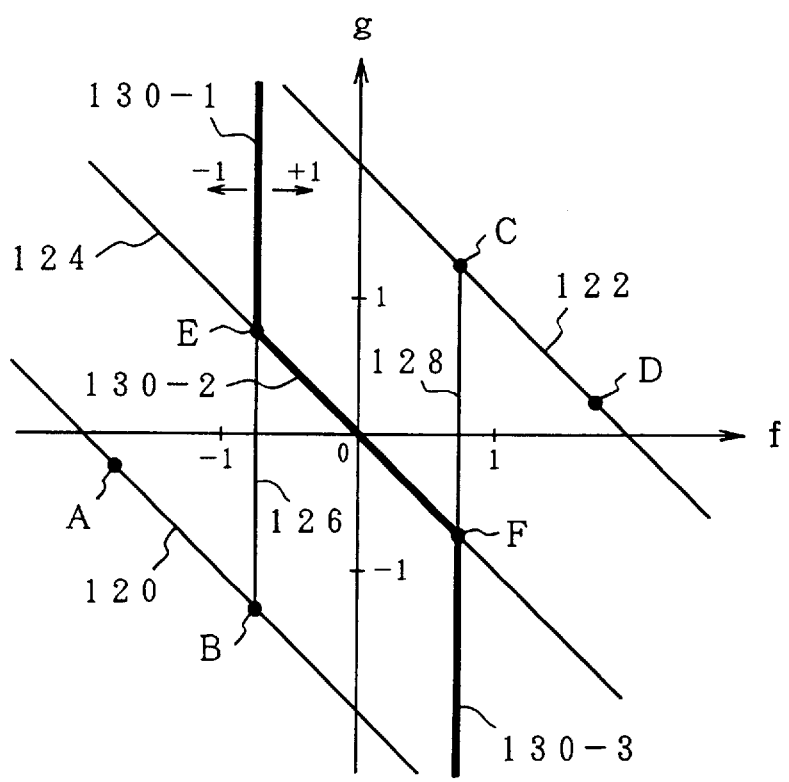
FIG. 8 is an explanatory diagram of the second embodiment of the decision slice according to the invention.

FIG. 8 is an explanatory diagram of an embodiment of mode 2 of the decision slice according to the invention. In the embodiment of the mode 2, in a manner similar to the embodiment of mode 1 in FIG. 6, the straight line 124 which passes through the origin (O) and is parallel with both of the straight line 120 connecting the noiseless coordinates points (A) and (B) and the straight line 122 connecting the noiseless coordinates points (C) and (D) is assumed. Further, a straight line 126 which is parallel with the coordinate axis (g) and passes through the coordinates (B) near the origin (O) in the noiseless coordinates (A) and (B) to be judged as −1 is assumed. An intersection point (E) between the straight lines 124 and 126 is obtained. A straight line 128 which is parallel with the coordinate axis (g) and passes through the coordinates (C) near the origin (O) in the noiseless coordinates (C) and (D) to be regarded as +1 is assumed. An intersection point (F) between the straight lines 124 and 128 is obtained. As a decision slice of the second embodiment, in a center portion, a straight line portion 130-2 between intersection points (E) and (F) of the straight line 124 and the straight lines 126 and 128 is set as a decision slice. With respect to the left side of the straight line portion 130-2 as a central decision slice, a straight line portion 130-1 which is in the straight line 126 passing through the intersection point (E) and is away from the coordinates (B) is set as a decision slice. With regard to the right side, a straight line portion 130-3 which is in the straight line 128 passing through the intersection point (F) and is away from the coordinates (C) is set as a decision slice. Thus, the decision slice in the embodiment of the mode 2 in FIG. 8 is set as a composite straight line coupling the straight line portions 130-1, 130-2, and 130-3. According to the decision slice in the embodiment of the mode 2, in a manner similar to the embodiment of the mode 1 of FIG. 6, a probability of the erroneous judgment of the input transmission series $a_n$ of the 2-input judging unit 108 can be improved by 2.1 dB (27%) as compared with the conventional decision slice of FIG. 2.

Figure 9:
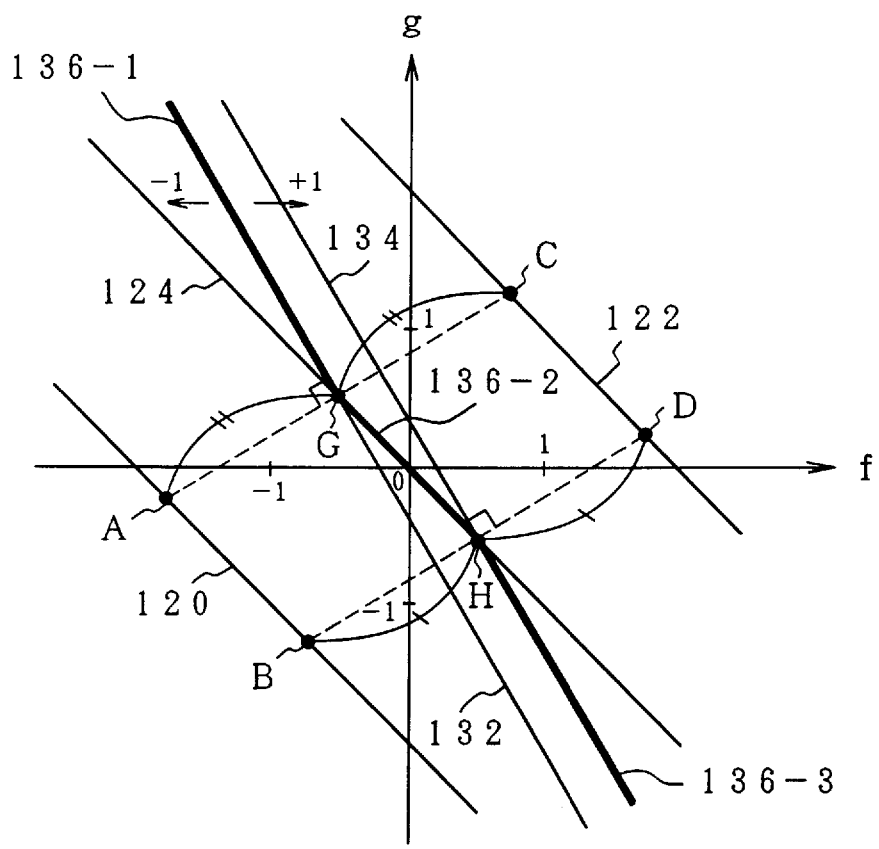
FIG. 9 is an explanatory diagram of the third embodiment of the decision slice according to the invention.

FIG. 9 shows an embodiment of mode 3 to set the decision slice according to the invention. In the embodiment of the mode 3, the straight line 124, which passes through the origin (O) and is parallel with both of the straight line 120 passing through the coordinates (A) and (B) to be judged as −1 and the straight line 122 passing through the coordinates (C) and (D) to be judged as +1, is similar to the first and second embodiments of FIGS. 6 and 8. In addition, according to the embodiment of mode 3, combinations (A, C) and (B, D) of two noiseless coordinates which should be judged and in which the k-th transmission codes are different and the adjacent transmission codes are equal are further obtained and straight lines 132 and 134 whose distances from each coordinate of each combination are equal are assumed. When the straight line 132 located at the same distance from the coordinates (A) and (C) and the straight line 134 located at the same distance from the coordinates (B) and (D) can be assumed, an intersection point of the straight lines 124 and 132 is set to (G) and an intersection point of the straight lines 124 and 134 is set to (H). As shown by a bold line, with respect to a center portion, a straight line portion 136-2 between the intersection points (G) and (H) of the straight line 124 is set to the decision slice. With regard to the outside of the intersection point (G), a straight line portion 136-1 which is in the straight line 132 and is away from the coordinates (A) and (B) is set to the decision slice. With respect to the outside of the intersection point (H), a straight line portion 136-3 which is in the straight line 134 and is away from the coordinates (C) and (D) is set to the decision slice. Namely, the decision slice in the embodiment of mode 3 of FIG. 9 is set by a composite straight line coupling the straight line portions 136-1, 136-2, and 136-3. According to the decision slice of the embodiment of mode 3, a probability of the erroneous judgment of the input transmission code series can be improved by 2.2 dB as compared with the conventional decision slice of FIG. 2.

Figure 10:
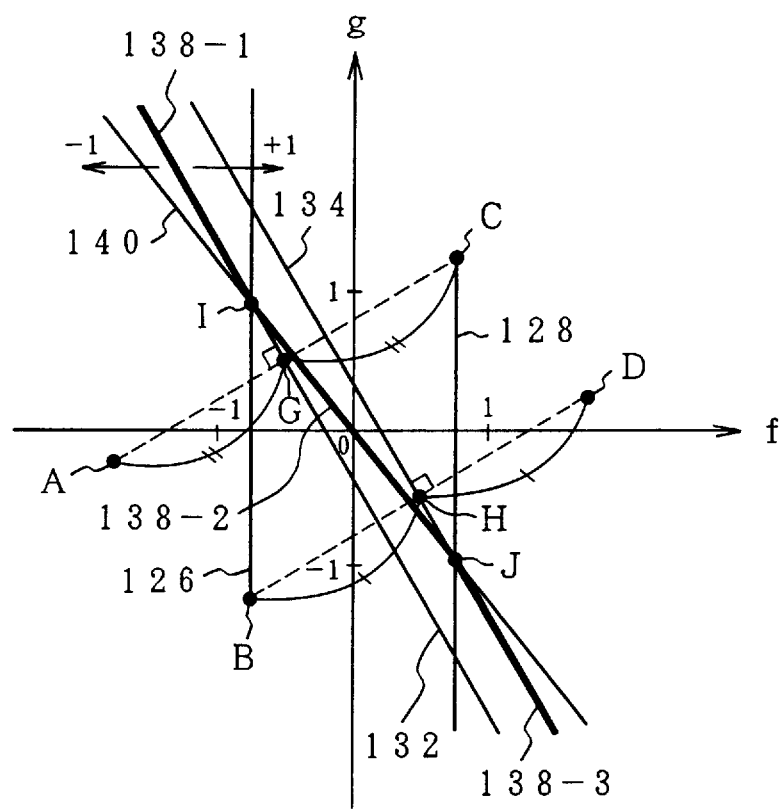
FIG. 10 is an explanatory diagram of the fourth embodiment of the decision slice according to the invention.

FIG. 10 shows an embodiment of mode 4 to set the decision slice according to the invention. In the embodiment of mode 4, in a manner similar to the embodiment of mode 3 of FIG. 9, the straight line 132 located at the same distance from the coordinates (A) and (C) and the straight line 134 located at the same distance from the coordinates (B) and (D) are assumed. Further, in the two coordinates (A) and (B) to be judged as −1, the straight line 126 which is parallel with the coordinate axis (g) and passes through the coordinates (B) near the origin (O) is assumed. An intersection point (I) between the straight lines 126 and 132 is obtained. In the coordinates (C) and (D) to be judged as +1, the straight line 128 which is parallel with the coordinate axis (g) and passes through the coordinates (C) near the origin (O) is assumed. An intersection point (J) between the straight lines 128 and 134 is obtained. A decision slice shown by a bold line is set to a straight line portion 138-2 of a straight line 140 passing through the intersection points (I) and (J) with respect to the center portion. With regard to the outside of the intersection point (I), a straight line portion 138-1 which is in the straight line 132 and is away from the coordinates (A) and (B) is set to the decision slice. Further, with respect to the outside of the intersection point (J), a straight line portion 138-3 which is in the straight line 134 and is away from the coordinates (C) and (D) is set to the decision slice. That is, the decision slice in the embodiment of mode 4 is set as a composite straight line coupling the straight line portions 138-1, 138-2, and 138-3. According to the setting of the decision slice in the embodiment of mode 4 of FIG. 10, a probability of the erroneous judgment of the input transmission code series can be improved by 2.4 dB as compared with the conventional decision slice of FIG. 2. Among the four embodiments, the largest improving effect can be obtained.

The above embodiments have been described with respect to the case where the filter outputs of different inter-waveform interference coefficients with respect to the two bits of the k-th and (k+1)th bits have been used as outputs (f) and (g) of the two correlation filters, namely, the first and second waveform shaping filters for the 2-input judging unit as an example. However, the invention can be also applied in substantially the same manner with respect to the case where two kinds of waveform shaping filters of different inter-waveform interference coefficients are used with respect to three bits of the (k−1)th, k-th, and (k+1)th bits. In this case, the correlation filter outputs (f) and (g) are given by $f=1.0a_k+0.5a_{k+1}-0.5a_{k-1}$ $g=1.0a_k-0.5a_{k+1}-0.5a_{k-1}$ In this instance, the four noiseless coordinates (A) to (D) are set to the following values:

A(−1.75, −0.25)
B(−0.75, −1.25)
C(+0.75, +1.25)
D(+1.75, +0.25)

Further, as two kinds of waveform shaping filters of different inter-waveform interference coefficients to produce the filter signals (f) and (g) which are inputted to the 2-input judging unit, it will be obviously understood that a proper number of interference coefficients other than 2 or 3 can be used as inter-waveform interference coefficients.

According to the invention as mentioned above, as a decision slice of the 2-input judging unit provided for the decision feedback equalizer, by setting the optimum decision slice which reduces an area that becomes a cause of the erroneous judgment because of an extreme reduction of the distance by minimizing a change in distance to the decision slice for the noiseless coordinates, a desired S/N ratio to obtain a specified error rate can be reduced. The reliability of the signal reproduction in the magnetic disk apparatus of a high transfer speed and a high density recording can be remarkably improved.

What is claimed is:

1. A decision feedback equalizer in which input code series ($a_k$, $a_{k+1}$) having two values of +1 and/or −1 are inputted to a 2-input judging unit through first and second waveform shaping filters in which an inter-waveform interference occurs at a 1-sample interval and inter-waveform interference coefficients are different, input coordinates (f, g) of a 2-dimensional coordinate space are set by said 2-input judging unit on the basis of input signals (f) and (g) from said filters, and said input coordinates (f, g) are compared with a predetermined decision slice, thereby judging values of said 2-value input code series, wherein said 2-input judging unit has a decision slice setting unit, and for two coordinates (A) and (B) to be judged as −1 and two coordinates (C) and (D) to be judged as +1 into which said input coordinates (f, g) can be set in a noiseless state, said decision slice setting unit sets a straight line, as a decision slice, which passes through an origin and is parallel with each of a straight line connecting said two coordinates (A) and (B) to be judged as −1 and a straight line connecting said two coordinates (C) and (D) to be judged as +1 which are in a parallel relation.

2. An equalizer according to claim 1, further comprising:
a forward filter for forming a correlation waveform $r_n$ from input code series $a_n$ from a transmission channel;
a feedback filter for obtaining an inter-waveform interference amount $ISI_k$ from a sum of products of judgment results of said 2-input judging unit and predetermined inter-waveform interference coefficients (h); and
adding unit for inputting, in parallel, code series $y_n$ obtained by subtracting said inter-waveform interference amount $ISI_k$ from said correlation waveform $r_n$ to said first and second waveform shaping filters.

3. An equalizer according to claim 1, further comprising:
a forward filter for forming a correlation waveform $r_n$ from input code series $a_n$ from a transmission channel;
a feedback filter for obtaining an inter-waveform interference amount $ISI_k$ by a sum of products of (P−1) judgment results and an inter-waveform interference coefficient (h) said (P−1) judgment results being among (P) judgment results of inter-waveform interferences by said 2-input judging unit: and
a first adding unit for inputting, in parallel, a code series $y_n$ obtained by subtracting said inter-waveform interference amount $ISI_k$ from said correlation waveform $r_n$ to said first and second waveform shaping filters;
and wherein each of said first and second waveform shaping filters have
a multiplier so that one of said first and second waveform shaping filters multiplies one of two kinds of different correlation waveform generating coefficients hf and hg, and so that the other of said first and second waveform shaping filter multiplies the other of said coefficients hf and hg, by a selected one of said judgement results, and
a second adding unit for inputting signals (f) and (g) obtained by subtracting output values of said multipliers from said code series $y_n$ of said first adding unit to said 2-input judging unit.

4. An equalizer according to claim 2 or 3, wherein said transmission channel is a magnetic conversion channel including a write head, a recording medium, and a read head of a magnetic recording apparatus.

5. A decision feedback equalizer in which input code series ($a_k$, $a_{k+1}$) having two values of +1 and/or −1 are inputted to a 2-input judging unit through first and second waveform shaping filters in which an inter-waveform interference occurs at a 1-sample interval and inter-waveform interference coefficients are different, input coordinates (f, g) of a 2-dimensional coordinate space are set by said 2-input judging unit on the basis of input signals (f) and (g) from said filters, and said input coordinates (f, g) are compared with a predetermined decision slice, thereby judging values of said 2-value input code series, wherein said 2-input judging unit has a decision slice setting unit and,
for two coordinates (A) and (B) to be judged as −1 and two coordinates (C) and (D) to be judged as +1 into which said input coordinates (f, g) can be set in a noiseless state, said decision slice setting unit assumes a first straight line which passes through an origin and is parallel with each of a straight line connecting said two coordinates (A) and (B) to be judged as −1 and a straight line connecting said two coordinates (C) and (D) to be judged as +1, a second straight line which passes through the coordinate (B) near the origin in said two coordinates (A) and (B) to be judged as −1 and is parallel with a coordinate axis (g), and a third straight line which passes through the coordinate (C) near the origin in said two coordinates (C) and (D) to be judged as +1 and is parallel with said coordinate axis (g), and said decision slice setting unit sets said decision slice by a composite straight line obtained by connecting a straight line portion which is in said second straight line and is away from an intersection point of said first and second straight lines for said coordinates (A) and (B), a straight line portion which is in said first straight line and passes through the origin between an intersection point of said first and second straight lines and an intersection point of said first and third straight lines, and a straight line portion which is in said third straight line and is away from an intersection point of said first and third straight lines for said coordinates (C) and (D).

6. An equalizer according to claim 5, further comprising:

a forward filter for forming a correlation waveform $r_n$ from input code series $a_n$ from a transmission channel;

a feedback filter for obtaining an inter-waveform interference amount $ISI_k$ from a sum of products of judgment results of said 2-input judging unit and predetermined inter-waveform interference coefficients (h); and adding unit for inputting, in parallel, code series $y_n$ obtained by subtracting said inter-waveform interference amount $ISI_k$ from said correlation waveform $r_n$ to said first and second waveform shaping filters.

7. An equalizer according to claim 5, further comprising:

a forward filter for forming a correlation waveform $r_n$ from input code series $a_n$ from a transmission channel;

a feedback filter for obtaining an inter-waveform interference amount $ISI_k$ from a sum of products of (P−1) judgment results and an inter-waveform interference coefficient (h) said (P−1) judgment results being among (P) judgment results of the inter-waveform interferences by said 2-input judging unit; and a first adding unit for inputting, in parallel, code series $y_n$ obtained by subtracting said inter-waveform interference amount $ISI_k$ from said correlation waveform $r_n$ to said first and second waveform shaping filters, and wherein each of said first and second waveform shaping filters have a multiplier so that one of said first and second waveform shaping filters multiplies one of two kinds of different correlation waveform generating coefficients hf and hg, and so that the other of said first and second waveform shaping filter multiplies the other of said coefficients hf and hg, by a selected one of said judgement results, and a second adding unit for inputting signals (f) and (g) obtained by subtracting output values of said multipliers from said code series $y_n$ of said first adding unit to said 2-input judging unit.

8. An equalizer according to claim 6 or 7, wherein said transmission channel is a magnetic conversion channel including a write head, a recording medium, and a read head of a magnetic recording apparatus.

9. A decision feedback equalizer in which input code series ($a_k$, $a_{k+1}$) having two values of +1 and/or −1 are inputted to a 2-input judging unit through first and second waveform shaping filters in which an inter-waveform interference occurs at a 1-sample interval and inter-waveform interference coefficients are different, input coordinates, (f, g) of a 2-dimensional coordinate space are set by said 2-input judging unit on the basis of input signals (f) and (g) from said filters, and said input coordinates (f, g) are compared with a predetermined decision slice, thereby judging values of said 2-value input code series, wherein said 2-input judging unit has a decision slice setting unit and, for two coordinates (A) and (B) to be judged as −1 and two coordinates (C) and (D) to be judged as +1 into which said input coordinates (f, g) can be set in a noiseless state, said decision slice setting unit assumes a first straight line which passes through an origin and is parallel with each of a straight line connecting said two coordinates (A) and (B) to be judged as −1 and a straight line connecting said two coordinates (C) and (D) to be judged as +1 and a second straight line whose distance from each of said coordinates (A) and (C) are set to be constants, a third straight line whose distance from each of said coordinates (B) and (D) is set to be constant, wherein in each of coordinates (A), (B), (C) and (D) only one of said input code series ($a_k$, $a_{k+1}$) in the noiseless state differs, and said decision slice setting unit sets said decision slice by a composite straight line obtained by connecting a straight line portion which is in said second straight line and is away from an intersection point of said first and second straight lines for said coordinates (A) and (B), a straight line portion which is in said first straight line and passes through the origin between and intersection point of said first and second straight lines and an intersection point of said first and third straight lines, and a straight line portion which is in said third straight line and is away from an intersection point of said first and third straight lines for said coordinates (C) and (D).

10. An equalizer according to claim 9, further comprising:

a forward filter for forming a correlation waveform $r_n$ from input code series $a_n$ from a transmission channel;

a feedback filter for obtaining an inter-waveform interference amount $ISI_k$ from a sum of products of judgment results of said 2-input judging unit and predetermined inter-waveform interference coefficients (h); and adding unit for inputting, in parallel, code series $y_n$ obtained by subtracting said inter-waveform interference amount $ISI_k$ from said correlation waveform $r_n$ to said first and second waveform shaping filters.

11. An equalizer according to claim 9, further comprising:

a forward filter for forming a correlation waveform $r_n$ from input code series $a_n$ from a transmission channel;

a feedback filter for obtaining an inter-waveform interference amount $ISI_k$ by a sum of products of (P−1) judgment results and an inter-waveform interference coefficient (h) said (P−1) judgment results being among (P) judgment results of inter-waveform interferences by said 2-input judging unit; and a first adding unit for inputting, in parallel, code series $y_n$ obtained by subtracting said inter-waveform interference amount $ISI_k$ from said correlation waveform $r_n$ to said first and second waveform shaping filters;

and wherein each of said first and second waveform shaping filters have a multiplier so that one of said first and second waveform shaping filters multiplies one of two kinds of different correlation waveform generating coefficients hf and hg, and so that the other of said first and second waveform shaping filter multiplies the other of said coefficients hf and hg, by a selected one of said judgement results, and a second adding unit for inputting signals (f) and (g) obtained by subtracting output values of said multipliers from said code series $y_n$ of said first adding unit to said 2-input judging unit.

12. An equalizer according to claim 10 or 11, wherein said transmission channel is a magnetic conversion channel including a write head, a recording medium, and a read head of a magnetic recording apparatus.

13. A decision feedback equalizer in which input code series ($a_k$, $a_{k+1}$) having two values of +1 and/or −1 are inputted to a 2-input judging unit through first and second waveform shaping filters in which an inter-waveform interference occurs at a 1-sample interval and inter-waveform interference coefficients are different, input coordinates (f, g) of a 2-dimensional coordinate space are set by said 2-input judging unit on the basis of input signals (f) and (g) from said filters, and said input coordinates (f, g) are compared with a predetermined decision slice, thereby judging values of said 2-value input code series, wherein said 2-input judging unit has a decision slice setting unit and, for two coordinates (A) and (B) to be judged as −1 and two coordinates (C) and (D) to be judged as +1 into which said input coordinates (f, g) can be set in a noiseless state, said decision slice setting unit assumes a first straight line whose distance from each of said coordinates (A) and (C) are set to be constant, a second straight line whose distance from each of said coordinates (B) and (D) is set to be constant, wherein in each of coordinates (A), (B), (C) and (D) only one of said input code series ($a_k$, $a_{k+1}$) in the noiseless state differs, a third straight line which passes through the coordinate (B) near an origin in said two coordinates (A) and (B) to be judged as −1 and is parallel with a coordinate axis (g), and a fourth straight line which passes through the coordinate (C) near the origin in said two coordinates (C) and (D) to be judged as +1 and is parallel with said coordinate axis (g), and said decision slice setting unit sets said decision slice by a composite straight line obtained by connecting a straight line portion which is in said first straight line and is away from an intersection point of said first and third straight lines for said coordinates (A) and (B), a straight line portion which connects an intersection point of said first and third straight lines and an intersection point of said second and fourth straight lines and passes through the origin, and a straight line portion which is in said second straight line and is away from an intersection point of said second and fourth straight lines for said coordinates (C) and (D).

14. An equalizer according to claim 13, further comprising:

a forward filter for forming a correlation waveform $r_n$ from input code series $a_n$ from a transmission channel;

a feedback filter for obtaining an inter-waveform interference amount $ISI_k$ from a sum of products of judgment results of said 2-input judging unit and predetermined inter-waveform interference coefficients (h); and adding unit for inputting, in parallel, code series $y_n$ obtained by subtracting said inter-waveform interference amount $ISI_k$ from said correlation waveform $r_n$ to said first and second waveform shaping filters.

15. An equalizer according to claim 13, further comprising:

a forward filter for forming a correlation waveform $r_n$ from input code series $a_n$ from a transmission channel;

a feedback filter for obtaining an inter-waveform interference amount $ISI_k$ by a sum of a products of (P−1) judgment results and an inter-waveform interference coefficient (h), said (P−1) judgment results being among (P) judgment results of inter-waveform interferences by said 2-input judging unit; and a first adding unit for inputting, in parallel, code series $y_n$ obtained by subtracting said inter-waveform interference amount $ISI_k$ from said correlation waveform $r_n$ to said first and second waveform shaping filters;

and wherein each of said first and second waveform shaping filters have a multiplier so that one of said first and second waveform shaping filters multiplies one of two kinds of different correlation waveform generating coefficients hf and hg, and so that the other of said first and second waveform shaping filter multiplies the other of said coefficients hf and hg, by a selected one of said judgement results, and a second adding unit for inputting signals (f) and (g) obtained by subtracting output values of said multipliers from said code series $Y_n$ of said first adding unit to said 2-input judging unit.

16. An equalizer according to claim 14 or 15, wherein said transmission channel is a magnetic conversion channel including a write head, a recording medium, and a read head of a magnetic recording apparatus.

17. A method of setting a 2-input decision slice of a decision feedback equalizer in which input code series ($a_k$, $a_{k+1}$) having two values of +1 and/or −1 are inputted to a 2-input judging unit through first and second waveform shaping filters in which an inter-waveform interference occurs at a 1-sample interval and inter-waveform interference coefficients are different, input coordinates (f, g) of a 2-dimensional coordinate space are set by said 2-input judging unit on the basis of input signals (f) and (g) from said filters, and said input coordinates (f, g) are compared with a predetermined decision slice, thereby judging values of said 2-value input code series, said method comprising the steps of:

for two coordinates (A) and (B) to be judged as −1 and two coordinates (C) and (D) to be judged as +1 into which said input coordinates (f, g) can be set in a noiseless state, connecting two coordinates (A) and (B) with a first straight line;

connecting two coordinates (C) and (D) with a second straight line; and setting a third straight line which passes through an origin and parallel with both said first and second straight lines as the decision slice.

18. A method according to claim 17, further comprising the steps of:

forming a correlation waveform $r_n$ by a forward filter from input code series $a_n$ from a transmission channel;

obtaining an inter-waveform interference amount $ISI_k$ by a feedback filter from a sum of products of judgment results of said 2-input judging unit and a predetermined inter-waveform interference coefficient (h); and obtaining code series $y_n$ by subtracting said inter-waveform interference amount $ISI_k$ from said correlation waveform $r_n$ and inputting said code series $y_n$ in parallel to said first and second waveform shaping filters.

19. A method according to claim 17, further comprising the steps of:

forming a correlation waveform $r_n$ by a forward filter from input code series $a_n$ from a transmission channel;

obtaining an inter-waveform interference amount $ISI_k$ by feedback filter by a sum of products of (P−1) judgment results and an inter-waveform interference coefficient (h), said (P−1)judgment results being among (P) judgment results of the inter-waveform interferences by said 2-input judging unit; and inputting, in parallel, code series $y_n$ obtained by subtracting said inter-waveform interference amount $ISI_k$ from said correlation waveform $r_n$ to said first and second waveform shaping filters, and wherein in each of said first and second waveform shaping filters, multiplying one of two different kinds of correlation waveform generating coefficients hf and hg by a selected one of said judgement results and, after that, signals (f) and (g) obtained by subtracting output values of said multipliers from said code series $y_n$ are inputted to said 2-input judging unit.

20. A method according to claim 18 or 19, wherein said transmission channel is a magnetic conversion channel including a write head, a recording medium, and a read head of a magnetic recording apparatus.

21. A method of setting a 2-input decision slice of a decision feedback equalizer in which input code series ($a_k$, $a_{k+1}$) having two values of +1 and/or −1 are inputted to a 2-input judging unit through first and second waveform shaping filters in which an inter-waveform interference occurs at a 1-sample interval and inter-waveform interference coefficients are different, input coordinates (f, g) of a 2-dimensional coordinate space are set by said 2-input judging unit on the basis of input signals (f) and (g) from said filters, and said input coordinates (f, g) are compared with a predetermined decision slice, thereby judging values of said 2-value input code series, said method comprising the steps of:

for two coordinates (A) and (B) to be judged as −1 and two coordinates (C) and (D) to be judged as +1 into which said input coordinates (f, g) can be set in a noiseless state, defining a first straight line passing through an origin and parallel with each of a connection line connecting said two coordinates (A) and (B) and a connection line connecting said two coordinates (C) and (D);

defining a second straight line passing through said coordinate (B) and parallel with a coordinate axis (g);

defining a third straight line passing through said coordinate (C) and parallel with said coordinate axis (g); and setting the decision slice by connecting said first straight line with said second straight line at a first intersection and said first straight line with said third straight line at a second intersection;

wherein the decision slice includes a portion of said second straight line leading away from said first intersection in a direction away from said coordinate (B), a portion of said first straight line between said first and second intersections, and a portion of said third straight line leading away from said second intersection in a direction away from said coordinate (C).

22. A method according to claim 21, further comprising the steps of:

forming a correlation waveform $r_n$ by a forward filter from input code series $a_n$ from a transmission channel;

obtaining an inter-wave form interference amount $ISI_k$ by a feedback filter from a sum of products of judgment results of said 2-input judging unit and a predetermined inter-waveform interference coefficient (h); and obtaining code series $y_n$ by subtracting said inter-waveform interference amount $ISI_k$ from said correlation waveform $r_n$ and inputting said code series $y_n$ in parallel to said first and second waveform shaping filters.

23. A method according to claim 21, further comprising the steps of:

forming a correlation waveform $r_n$ by a forward filter from input code series $a_n$ from a transmission channel;

obtaining an inter-waveform interference amount $ISI_k$ by a feedback filter by a sum of products of (P−1) judgment results and an inter-waveform interference coefficient (h), said (P−1) judgment results being among (P) judgment results of the inter-waveform interferences by said 2-input judging unit; and inputting, in parallel, code series $y_n$ obtained by subtracting said inter-waveform interference amount $ISI_k$ from said correlation waveform $r_n$ to said first and second waveform shaping filters, and wherein in each of said first and second waveform shaping filters, multiplying one of two different kinds of correlation waveform generating coefficients hf and hg and, after that, signals (f) and (g) obtained by subtracting output values of said multipliers from said code series $y_n$ are inputted to said 2-input judging unit.

24. A method according to claim 22 or 23, wherein said transmission channel is a magnetic conversion channel including a write head, a recording medium, and a read head of a magnetic recording apparatus.

25. A method of setting a 2-input decision slice of a decision feedback equalizer in which input code series ($a_k$, $a_{k+1}$) having two values of +1 and/or −1 are inputted to a 2-input judging unit through first and second waveform shaping filters in which an inter-waveform interference occurs at a 1-sample interval and inter-waveform interference coefficients are different, input coordinates (f, g) of a 2-dimensional coordinate space are set by said 2-input judging unit on the basis of input signal (f) and (g) from said filters, and said input coordinates (f, g) are compared with a predetermined decision slice, thereby judging values of said 2-value input code series, said method comprising the steps of:

for two coordinates (A) and (B) to be judged as −1 and two coordinates (C) and (D) to be judged as +1 into which said input coordinates (f, g) can be set in a noiseless state, defining a first straight line passing through an origin and parallel with each of a connection line connecting said two coordinates (A) and (B) and a connection line connecting said two coordinates (C) and (D);

defining a second straight line passing between, and equal distance from, a set of coordinates (A, C);

defining a third straight line passing between, and equal distance from, a set of coordinates (B, D);

wherein in each of said sets of coordinates (A, C) and (B, D) only one of the input code series ($a_k$, $a_{k+1}$) in the noiseless state differs;

setting the decision slice by connecting said first straight line with said second straight line at a first intersection and said first straight line with said third straight line at a second intersection;

wherein the decision slice includes a portion of said second straight line leading away from said first intersection in a direction away from said origin, a portion of said first straight line between said first and second intersections, and said third straight line leading away from said second intersection in a direction away from said origin.

26. A method according to claim 25, further comprising:

forming a correlation waveform $r_n$ by a forward filter from input code series $a_n$ from a transmission channel;

obtaining an inter-waveform interference amount $ISI_k$ by a feedback filter from a sum of products of judgment results of said 2-input judging unit and a predetermined inter-waveform interference coefficient (h); and obtaining code series $y_n$ by subtracting said inter-waveform interference amount $ISI_k$ from said correlation waveform $r_n$ and inputting said code series $y_n$ in parallel to said first and second waveform shaping filters.

27. A method according to claim 25, further comprising the steps of:

forming a correlation waveform $r_n$ by a forward filter from input code series $a_n$ from a transmission channel;

obtaining an inter-waveform interference amount $ISI_k$ by a feedback filter by a sum of products of (P−1) judgment results and an inter-waveform interference coefficient (h), said (P−1) judgment being among (P) judgment results of the inter-waveform interferences by said 2-input judging unit; and inputting, in parallel, code series $y_n$ obtained by subtracting said inter-waveform interference amount $ISI_k$ from said correlation waveform $r_n$ to said first and second waveform shaping filters, and wherein in each of said first and second waveform shaping filters, multiplying one of two different kinds of correlation waveform generating coefficients hf and hg by a selected one of said judgment results and, after that, signals (f) and (g) obtained by subtracting output values of said multipliers from said code series $y_n$ are inputted to said 2-input judging unit.

28. A method according to claim 26 or 27, wherein said transmission channel is a magnetic conversion channel including a write head, a recording medium, and a read head of a magnetic recording apparatus.

29. A method of setting a 2-input decision slice of a decision feedback equalizer in which input code series ($a_k$, $a_{k+1}$) having two values of +1 and/or −1 are inputted to a 2-input judging unit through first and second waveform shaping filters in which an inter-waveform interference occurs at a 1-sample interval and inter-waveform interference coefficients are different, input coordinates (f, g) of a 2-dimensional coordinate space are set by said 2-input judging unit on the basis of input signals (f) and (g) from said filters, and said input coordinates (f, g) are compared with a predetermined decision slice, thereby judging values of said 2-value input code series, said method comprising the steps of:

for two coordinates (A) and (B) to be judged as −1 and two coordinates (C) and (D) to be judged as +1 into which said input coordinates (f, g) can be set in a noiseless state, defining a first straight line passing between, and equal distance from, a set of coordinates (A, C);

defining a second straight line passing between, and equal distance from, a set of coordinates (B, D);

defining a third straight line passing said coordinate (B), and parallel with a coordinate axis (g);

wherein in each of said sets of coordinates (A, C) and (B, D) only one of the input code series ($a_k$, $a_{k+1}$) in the noiseless state differs;

defining a fourth straight line passing through said coordinate (C) and parallel with said coordinate axis (a); and setting the decision slice by connecting said first and third straight lines at a first intersection, and said second and fourth straight lines at a second intersection;

wherein the decision slice includes a portion of said first straight line leading away from said first intersection in a direction away from said origin, a portion of fifth straight line connecting said first and second intersections and passing through said origin, and a portion of said second straight line leading away from said second intersection in a direction away from said origin.

30. A method according to claim 29, further comprising the steps of:

forming a correlation waveform $r_n$ by a forward filter from input code series $a_n$ from a transmission channel;

obtaining an inter-waveform interference amount $ISI_k$ by a feedback filter from a sum of products of judgment results of said 2-input judging unit and a predetermined inter-waveform interference coefficient (h); and obtaining code series $y_n$ by subtracting said inter-waveform interference amount $ISI_k$ from said correlation waveform $r_n$ and inputting said code series $y_n$ in parallel to said first and second waveform shaping filters.

31. A method according to claim 29, further comprising the steps of:

forming a correlation waveform $r_n$ by a forward filter from input code series $a_n$ from a transmission channel;

obtaining an inter-waveform interference amount $ISI_k$ by a feedback filter by the sum of products of (P−1) judgment results and an inter-waveform interference coefficient (h), said (P−1) judgment results being among (P) judgment results of the inter-waveform interferences by said 2-input judging unit; and inputting, in parallel, code series $y_n$ obtained by subtracting said inter-waveform interference amount $ISI_k$ from said correlation waveform $r_n$ to said first and second waveform shaping filters, and wherein in each of said first and second waveform shaping filters, multiplying one of two different kinds of correlation waveform generating coefficients hf and hg by a selected one of said judgment results and, after that, signals (f) and (g) obtained by subtracting output values of said multipliers from said code series $y_n$ are inputted to said 2-input judging unit.

32. A method according to claim 30 or 31, wherein said transmission channel is a magnetic conversion channel including a write head, a recording medium, and a read head of a magnetic recording apparatus.

* * * * *

UNITED STATES PATENT AND TRADEMARK OFFICE
CERTIFICATE OF CORRECTION

PATENT NO. : 5,809,073
DATED : September 15, 1998
INVENTOR(S) : Hiroaki Ueno

It is certified that error appears in the above-identified patent and that said Letters Patent is hereby corrected as shown below:

Column 3, lines 24-25, delete "passesthrough" and insert --passes through-- therefor;

Column 7, line 21, delete "r." and insert --$r_n$-- therefor;

Column 7, line 51, after "hp-1}" begin a new line

Column 8, line 34, delete "a re" and insert --are-- therefor;

Column 9, line 47, after "[hi-hg"] begin a new line

Column 10, line 6, delete "ⓐ" and insert --â-- therefor;

UNITED STATES PATENT AND TRADEMARK OFFICE
CERTIFICATE OF CORRECTION

PATENT NO. : 5,809,073
DATED : September 15, 1998
INVENTOR(S) : Hiroaki Ueno

It is certified that error appears in the above-identified patent and that said Letters Patent is hereby corrected as shown below:

Column 10, line 9, delete "ⓐ" and insert --â-- therefor;

Column 10, line 14, delete "ⓐ" and insert --â-- therefor;

Column 10, line 21, delete "ⓐ" and insert --â-- therefor;

Column 12, line 14, delete "embodiment of the"

and insert --embodiment of-- therefor;

Column 16, line 26, delete "constants" and insert

--constant-- therefor;

UNITED STATES PATENT AND TRADEMARK OFFICE
CERTIFICATE OF CORRECTION

PATENT NO. : 5,809,073
DATED : September 15, 1998
INVENTOR(S) : Hiroaki Ueno

It is certified that error appears in the above-identified patent and that said Letters Patent is hereby corrected as shown below:

Column 20, line 35, after "hg" insert --by a selected one of said judgement results--

Column 22, line 14, delete "(a)" and insert --(g)-- therefor;

Signed and Sealed this

Fourteenth Day of December, 1999

Attest:

Q. TODD DICKINSON

*Attesting Officer*   *Acting Commissioner of Patents and Trademarks*